(12) United States Patent
Kuroki

(10) Patent No.: US 9,691,700 B2
(45) Date of Patent: Jun. 27, 2017

(54) SEMICONDUCTOR DEVICE INCLUDING FIRST AND SECOND DUMMY WIRINGS

(75) Inventor: Koji Kuroki, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 1330 days.

(21) Appl. No.: 13/137,252

(22) Filed: Aug. 1, 2011

(65) Prior Publication Data

US 2012/0043642 A1 Feb. 23, 2012

(30) Foreign Application Priority Data

Aug. 19, 2010 (JP) ................................. 2010-184131

(51) Int. Cl.
*G11C 11/00* (2006.01)
*H01L 23/522* (2006.01)
*G11C 11/4097* (2006.01)
*H01L 27/108* (2006.01)

(52) U.S. Cl.
CPC ........ *H01L 23/522* (2013.01); *G11C 11/4097* (2013.01); *H01L 27/10814* (2013.01); *H01L 27/10885* (2013.01); *H01L 2924/0002* (2013.01)

(58) Field of Classification Search
None
See application file for complete search history.

(56) References Cited

U.S. PATENT DOCUMENTS

| 5,515,324 | A | 5/1996 | Tanaka |
| 6,532,173 | B2 | 3/2003 | Iioka et al. |
| 7,092,274 | B2 * | 8/2006 | Hoya et al. ................... 365/145 |
| 7,428,161 | B2 * | 9/2008 | Kanda .............................. 365/63 |
| 7,477,561 | B2 | 1/2009 | Hirabayashi |
| 7,593,276 | B2 | 9/2009 | Hirabayashi |
| 7,675,784 | B2 * | 3/2010 | Kaneda .................... 365/185.25 |
| 7,902,573 | B2 | 3/2011 | Oyu |

FOREIGN PATENT DOCUMENTS

| JP | 2003-22684 A | 1/2003 |
| JP | 3512833 B2 | 1/2004 |
| JP | 2006-252636 | 9/2006 |
| JP | 2007-250020 A | 9/2007 |
| JP | 2009-010366 | 1/2009 |
| JP | 2009-81377 A | 4/2009 |

\* cited by examiner

*Primary Examiner* — Kretelia Graham
(74) *Attorney, Agent, or Firm* — Kunzler Law Group, PC

(57) ABSTRACT

A semiconductor device includes a first signal wiring, a first dummy wiring, and a second dummy wiring. The first signal wiring is configured to be supplied with a first signal potential. The first dummy wiring is insulated from the first wiring. The first dummy wiring is configured to be supplied with a fixed potential. The second dummy wiring is disposed between the first signal wiring and the first dummy wiring. The second dummy wiring is insulated from the first dummy wiring. The second dummy wiring is configured to be supplied with substantially the same potential as the first signal potential.

18 Claims, 7 Drawing Sheets

SEMICONDUCTOR DEVICE INCLUDING FIRST AND SECOND DUMMY WIRINGS

BACKGROUND OF THE INVENTION

Field of the Invention

The present invention generally relates to a semiconductor device. Priority is claimed on Japanese Patent Application No. 2010-184131, filed Aug. 19, 2010, the content of which is incorporated herein by reference.

Description of the Related Art

Semiconductor devices with a dummy wiring which is disposed at the edge part of a memory cell block have been generally known. The dummy wiring is formed to suppress the influence of sparseness and concentration of wirings. For example, in the memory cell block, there is usually a plurality of bit lines that are disposed repeatedly, forming a microfine pattern. If a dummy bit line is formed further to the outside from a bit line disposed at the outermost column of the memory cell block, it is possible to form the shape of the bit lines disposed in the outermost column with the same high precision as the shape of the other bit lines.

Japanese Unexamined Patent Application, First Publication, No. JP-A-2007-250020 discloses a semiconductor memory device as an example of a conventional semiconductor device having dummy wirings. Japanese Unexamined Patent Application, First Publication, No. JP-A-2007-250020 discloses the semiconductor memory device having a dummy word line that selects a first dummy cell group, and a dummy bit line on which data of the first dummy cell group is transferred. The dummy bit lines (DBLs) disclosed in Japanese Unexamined Patent Application, First Publication, No. JP-A-2007-250020 have an electrical potential that varies in response to potential control of a dummy word line (DWL).

With the shrinking of the size of semiconductor devices, investigations are being done regarding semiconductor devices including transistors with a structure having a small surface area, such as vertically structured transistors. In the vertically structured transistor, rather than the three electrodes of the transistor (source, gate, and drain) being arranged in the planar direction of the semiconductor substrate, they are arranged perpendicularly with respect to the semiconductor substrate, so that the surface area of the transistor can be made small.

For example, Japanese Unexamined Patent Application, First Publication, No. JP-A-2009-81377 discloses a semiconductor device in which a plurality of transistor rows made of a plurality of prismatic vertical MOS transistors that share a gate of a first type of conductivity are disposed and formed into an array configuration.

Japanese Unexamined Patent Application, First Publication, No. JP-A-2003-22684 discloses a nonvolatile semiconductor memory device that includes a third main bit line that supplies an electrical potential that is substantially the same potential as the drain potential to a sub-bit line that neighbors a sub-bit line that is the drain side of a selected memory cell.

Japanese patent, No. JP-B-3512833 discloses a nonvolatile semiconductor memory device including a data resetting means. The data resetting means looks for a bit line having a current leakage fault after data is loaded to a data circuit. Of the data in the data circuit, the data resetting means resets only the data corresponding to the faulty bit line.

SUMMARY

In one embodiment, a semiconductor device may include, but is not limited to, a first signal wiring, a first dummy wiring, and a second dummy wiring. The first signal wiring is configured to be supplied with a first signal potential. The first dummy wiring is insulated from the first wiring. The first dummy wiring is configured to be supplied with a fixed potential. The second dummy wiring is disposed between the first signal wiring and the first dummy wiring. The second dummy wiring is insulated from the first dummy wiring. The second dummy wiring is configured to be supplied with substantially the same potential as the first signal potential.

In another embodiment, a semiconductor device may include, but is not limited to, a bit line, a first dummy bit line, and a second dummy bit line. The bit line is configured to be supplied with a first voltage in a first mode. The bit line is configured to be free from the first voltage in a second mode. The first dummy bit line is provided adjacently to the bit line. The first dummy bit line is configured to be supplied with the first voltage in each of the first and second modes. The second dummy bit line is provided adjacently to the first dummy bit line. The second dummy bit line is configured to be supplied with a second voltage in each of the first and second modes. The second voltage is different from the first voltage.

In still another embodiment, a semiconductor device may include, but is not limited to, a substrate, a conductive layer, and a plurality of wirings. The conductive layer is disposed over the substrate. The plurality of wirings has a line-and-space pattern. The plurality of wirings are disposed in the conductive layer. The plurality of wirings includes a first outermost wiring and a sub-plurality of wirings. The first outermost wiring is disposed in an outermost side of the plurality of wirings. The first outermost wiring is insulated from the conductive layer. The sub-plurality of wirings are each coupled to the conductive layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
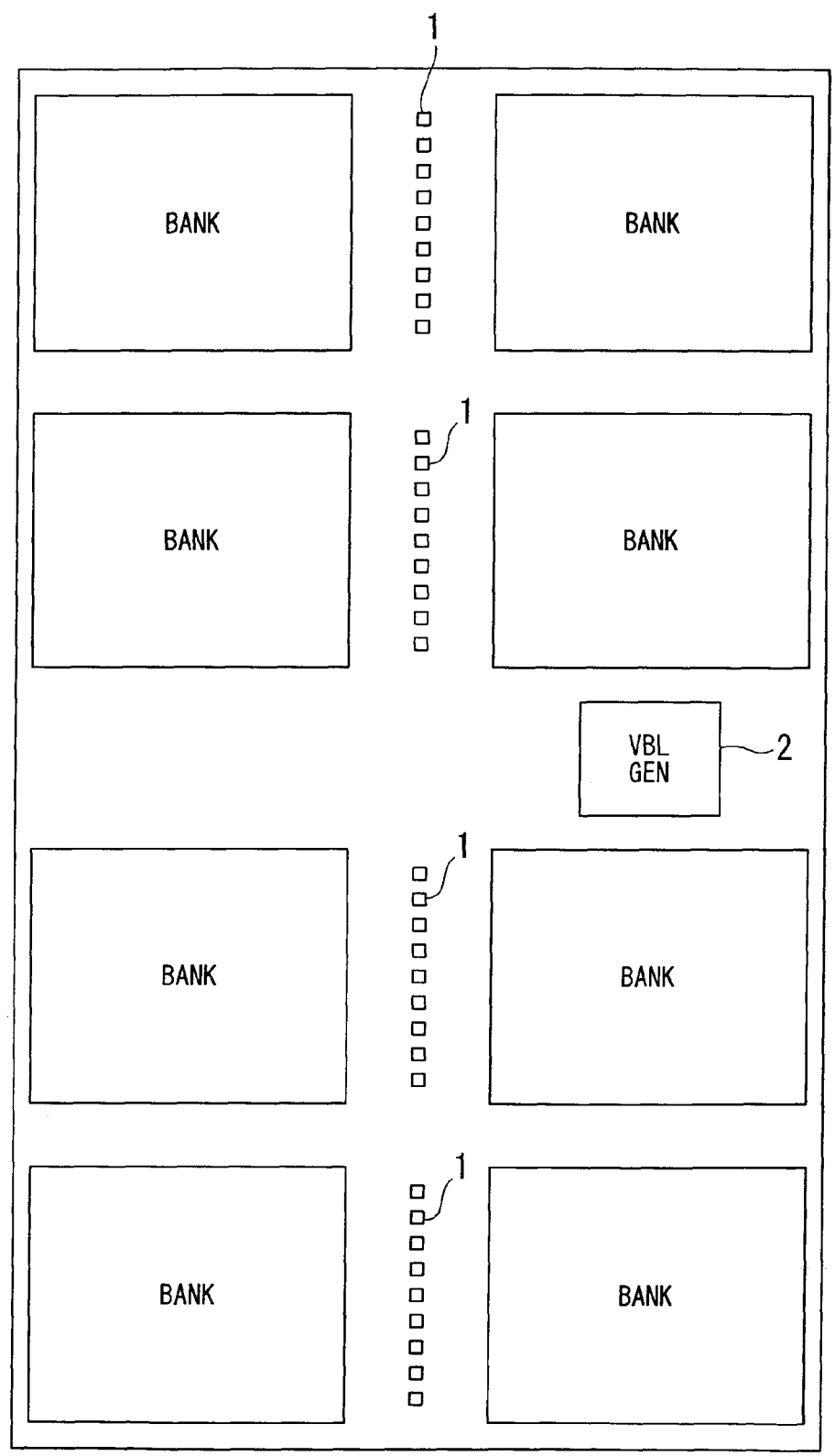
FIG. 1 is a schematic view illustrating the semiconductor memory device (DRAM) in accordance with one embodiment of the present invention.

Before describing the present invention, the related art will be explained in order to facilitate the understanding of the present invention.

As shown in Japanese Unexamined Patent Application, First Publication, No. JP-A-2009-81377, in the semiconductor device using the vertically structured transistor as a memory cell transistor, the bit line and the dummy bit lines are each formed within the semiconductor substrate via an insulating film.

In this case, although the dummy bit line is provided so as to make the shape of the bit line disposed at the edge part the same as the shape of the other bit lines, as noted above, the dummy bit line itself is not necessarily formed in a predetermined shape. Therefore, in the dummy bit line part, it can be envisioned that the shapes of the dummy bit line and the insulating film covering it, is not made uniform. When the insulating film is thinly formed, a leakage current might flow between the dummy bit line and the semiconductor substrate.

When a leakage current occurs, because the standby current and the like of the semiconductor device increases, it is necessary to prevent this.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a first signal wiring, a first dummy wiring, and a second dummy wiring. The first signal wiring is configured to be supplied with a first signal potential. The first dummy wiring is insulated from the first wiring. The first dummy wiring is configured to be supplied with a fixed potential. The second dummy wiring is disposed between the first signal wiring and the first dummy wiring. The second dummy wiring is insulated from the first dummy wiring. The second dummy wiring is configured to be supplied with substantially the same potential as the first signal potential.

In some cases, the semiconductor device may include, but is not limited to, the first signal wiring and the first and second dummy wirings being disposed in substantially the same level as each other.

In some cases, the semiconductor device may include, but is not limited to, the first and second dummy wirings having substantially the same line-pattern as the first signal wiring.

In some cases, the semiconductor device may further include, but is not limited to, a substrate embedded with the first signal wiring and the first and second dummy wirings.

In some cases, the semiconductor device may further include, but is not limited to, a memory cell coupled to the first signal wiring.

In some cases, the semiconductor device may include, but is not limited to, the fixed potential being substantially the same potential as the substrate potential.

In some cases, the semiconductor device may further include, but is not limited to, a first dummy transistor coupled to the second dummy wiring. The first dummy transistor is insulated from the first dummy wiring.

In some cases, the semiconductor device may further include, but is not limited to, a first memory cell and a word line coupled to the first memory cell. The first wiring is a first bit line embedded in the semiconductor substrate. The first and second dummy wirings are embedded in the semiconductor substrate.

In some cases, the semiconductor device may include, but is not limited to, the second dummy wiring being configured to be supplied with a bit line pre-charging potential.

In some cases, the semiconductor device may include, but is not limited to, the memory cell including a capacitor and a memory cell transistor coupled to the capacitor.

In another embodiment, a semiconductor device may include, but is not limited to, a bit line, a first dummy bit line, and a second dummy bit line. The bit line is configured to be supplied with a first voltage in a first mode. The bit line is configured to be free from the first voltage in a second mode. The first dummy bit line is provided adjacently to the bit line. The first dummy bit line is configured to be supplied with the first voltage in each of the first and second modes. The second dummy bit line is provided adjacently to the first dummy bit line. The second dummy bit line is configured to be supplied with a second voltage in each of the first and second modes. The second voltage is different from the first voltage.

In some cases, the semiconductor device may further include, but is not limited to, a first voltage line, a second voltage line, and a pre-charge transistor. The first voltage line is electrically coupled to the first dummy bit line. The second voltage line is electrically coupled to the second dummy bit line. The pre-charge transistor is provided between the bit line and the first voltage line. The pre-charge transistor is configured to turn on in the first mode and turn off in the second mode.

In some cases, the semiconductor device may further include, but is not limited to, a semiconductor substrate configured to be supplied with the second voltage. The first voltage is greater than the second voltage.

In some cases, the semiconductor device may further include, but is not limited to, a third dummy bit line provided adjacently to the second dummy bit line. The third dummy bit line is configured to be supplied with the second voltage.

In some cases, the semiconductor device may further include, but is not limited to, first, second and third memory cell transistors coupled to the bit line, the first dummy bit line and the second dummy bit line, respectively. The third dummy bit line is disconnected from any memory cell transistor.

In some cases, the semiconductor device may include, but is not limited to, the first mode including a pre-charge mode corresponding to a pre-charge command, and the second mode including an active mode corresponding to each of read and write commands.

In still another embodiment, a semiconductor device may include, but is not limited to, a substrate, a conductive layer, and a plurality of wirings. The conductive layer is disposed over the substrate. The plurality of wirings has a line-and-space pattern. The plurality of wirings are disposed in the conductive layer. The plurality of wirings includes a first outermost wiring and a sub-plurality of wirings. The first outermost wiring is disposed in an outermost side of the plurality of wirings. The first outermost wiring is insulated from the conductive layer. The sub-plurality of wirings are each coupled to the conductive layer.

In some cases, the semiconductor device may further include, but is not limited to, a contact connecting one of the second wirings and the conductive layer.

In some cases, the semiconductor device may include, but is not limited to, the conductive layer including an impurity diffusion layer in an upper region of the semiconductor substrate.

In some cases, the semiconductor device may further include, but is not limited to, a plurality of memory cells coupled to the sub-plurality of wrings, respectively, and isolated from the first outermost wiring.

Hereinafter, a semiconductor device according to an embodiment of the invention will be described in detail with reference to the drawings. In the embodiment, an example of applying the invention to a DRAM (Dynamic Random Access Memory) as the semiconductor device will be described. In the drawings used for the following description, to easily understand characteristics, there is a case where characteristic parts are enlarged and shown for convenience' sake, and ratios of constituent elements may not be the same as in reality. Materials, sizes, and the like exemplified in the following description are just examples. The invention is not limited thereto and may be appropriately modified within a scope which does not deviate from the concept of the invention.

First Embodiment

An embodiment to which the present invention is applied will be described in detail below, with references made to accompanying drawings.

Figure 2:
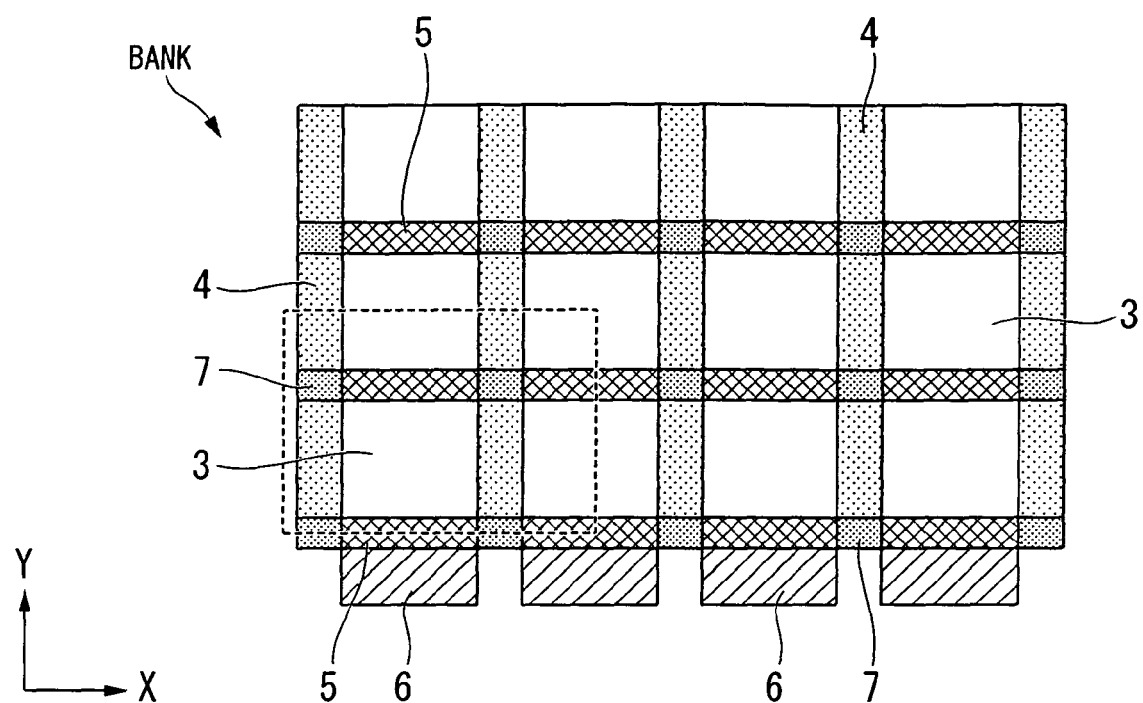
FIG. 2 is a fragmentary schematic view illustrating a bank in the semiconductor memory device of FIG. 1 in accordance with one embodiment of the present invention.
Figure 3:
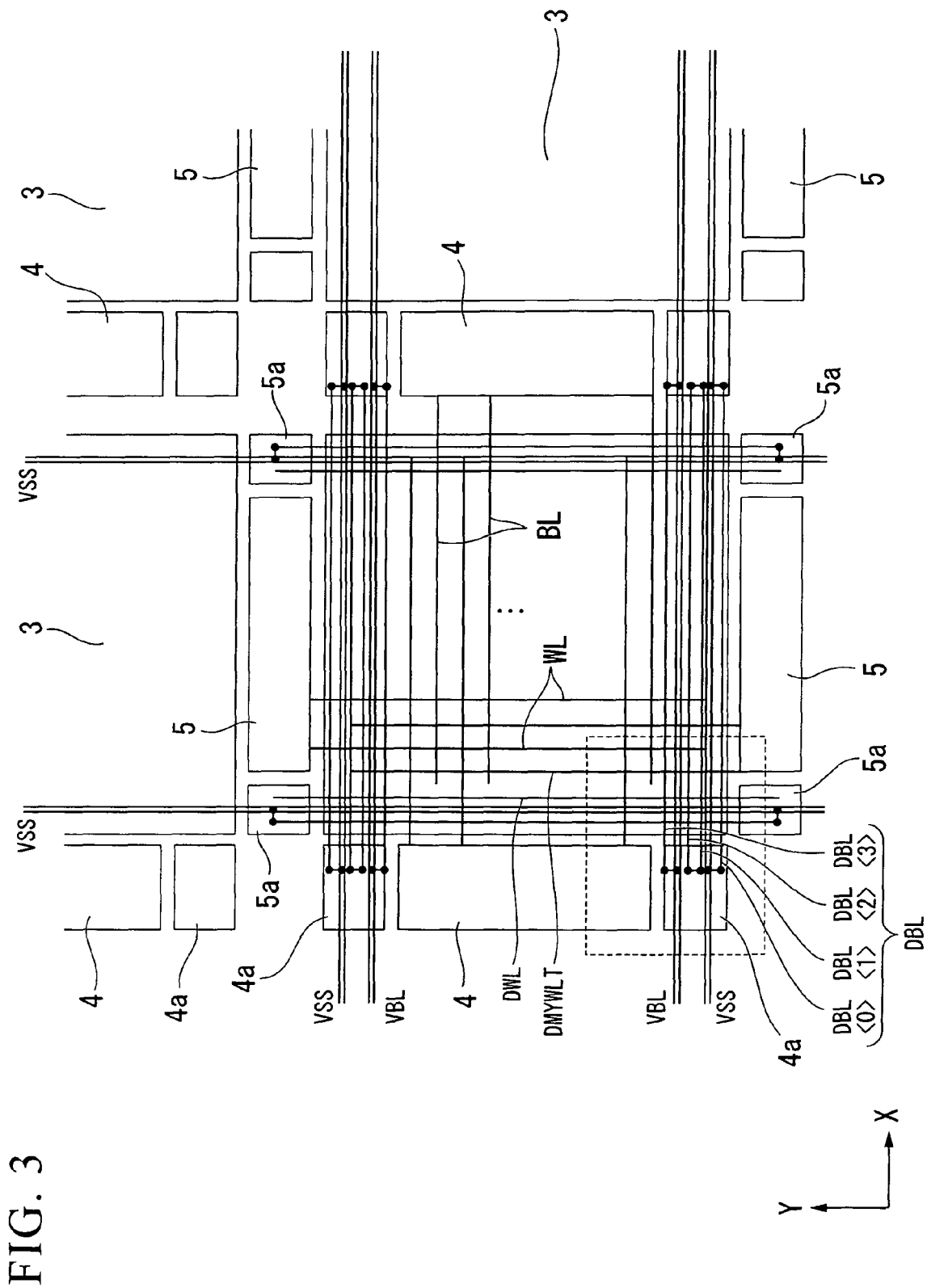
FIG. 3 is a fragmentary schematic diagram illustrating an area surrounded by a broken line of the semiconductor memory device in FIG. 2 in accordance with one embodiment of the present invention.
Figure 4:
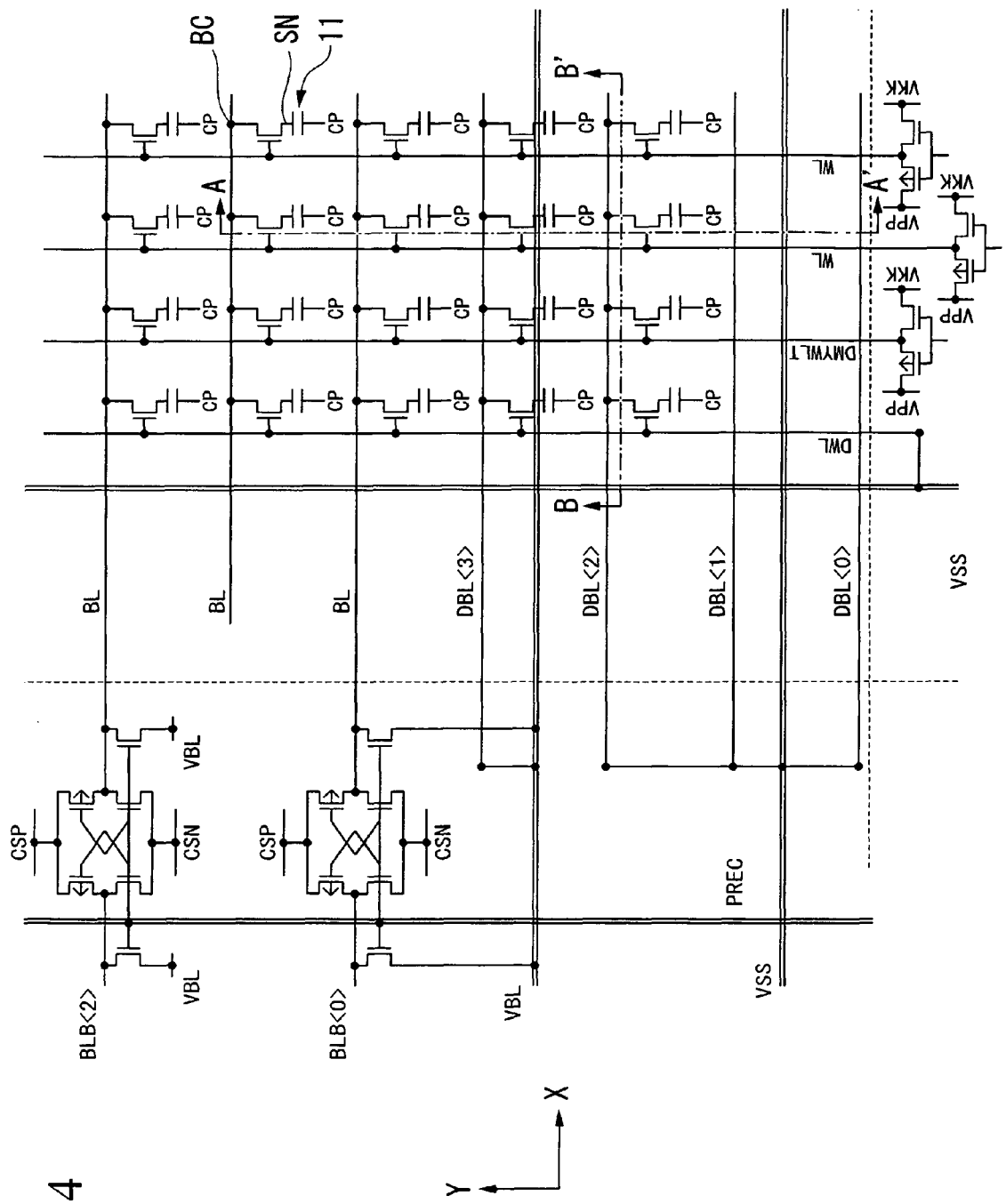
FIG. 4 is a fragmentary schematic diagram illustrating an area surrounded by a broken line of the semiconductor memory device in FIG. 3 in accordance with one embodiment of the present invention.
Figure 5:
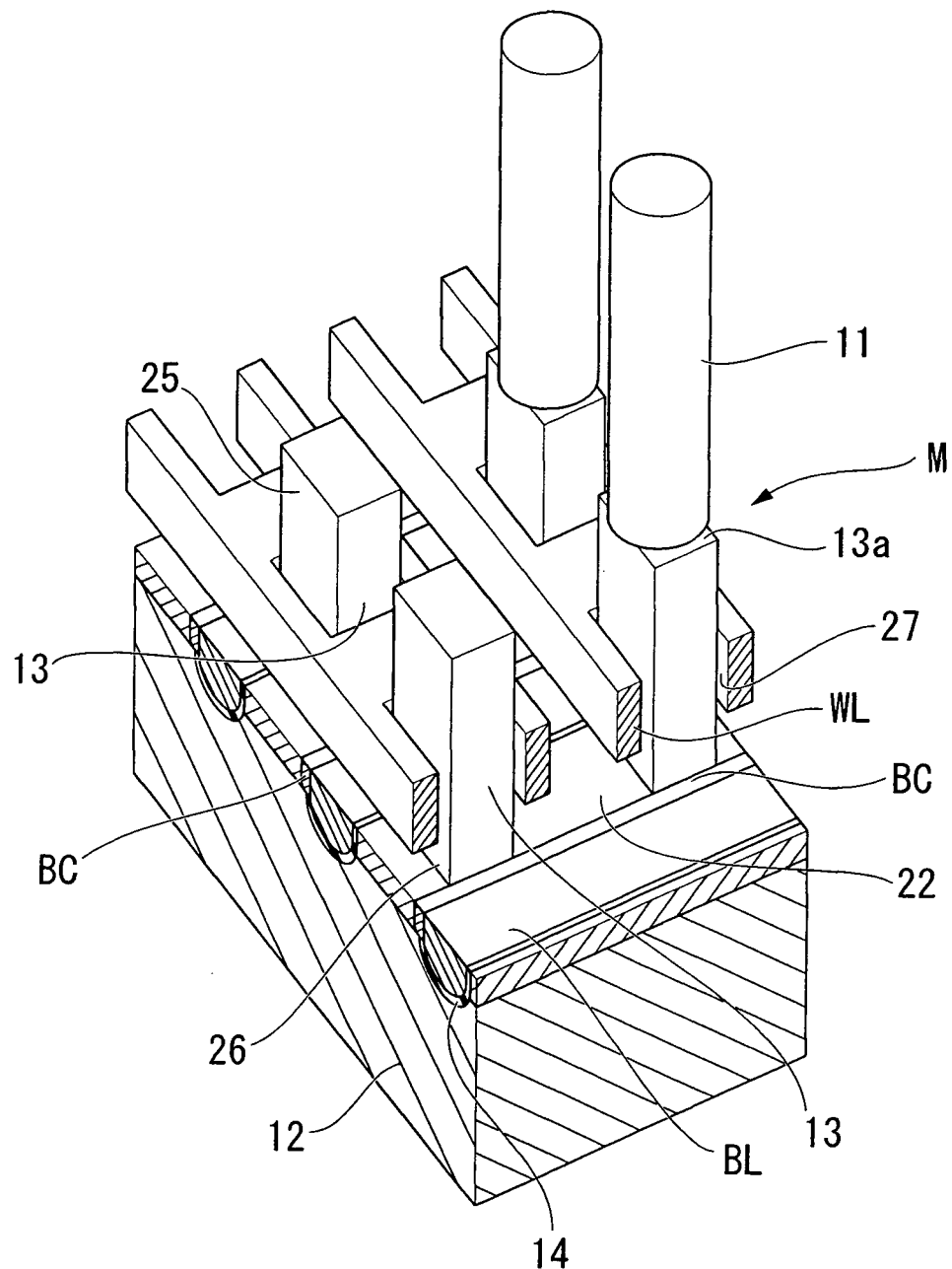
FIG. 5 is fragmentary perspective view illustrating a memory cell of the semiconductor memory device in FIGS. 1 to 4 in accordance with one embodiment of the present invention.
Figure 5:
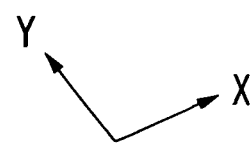
Figure 6A:
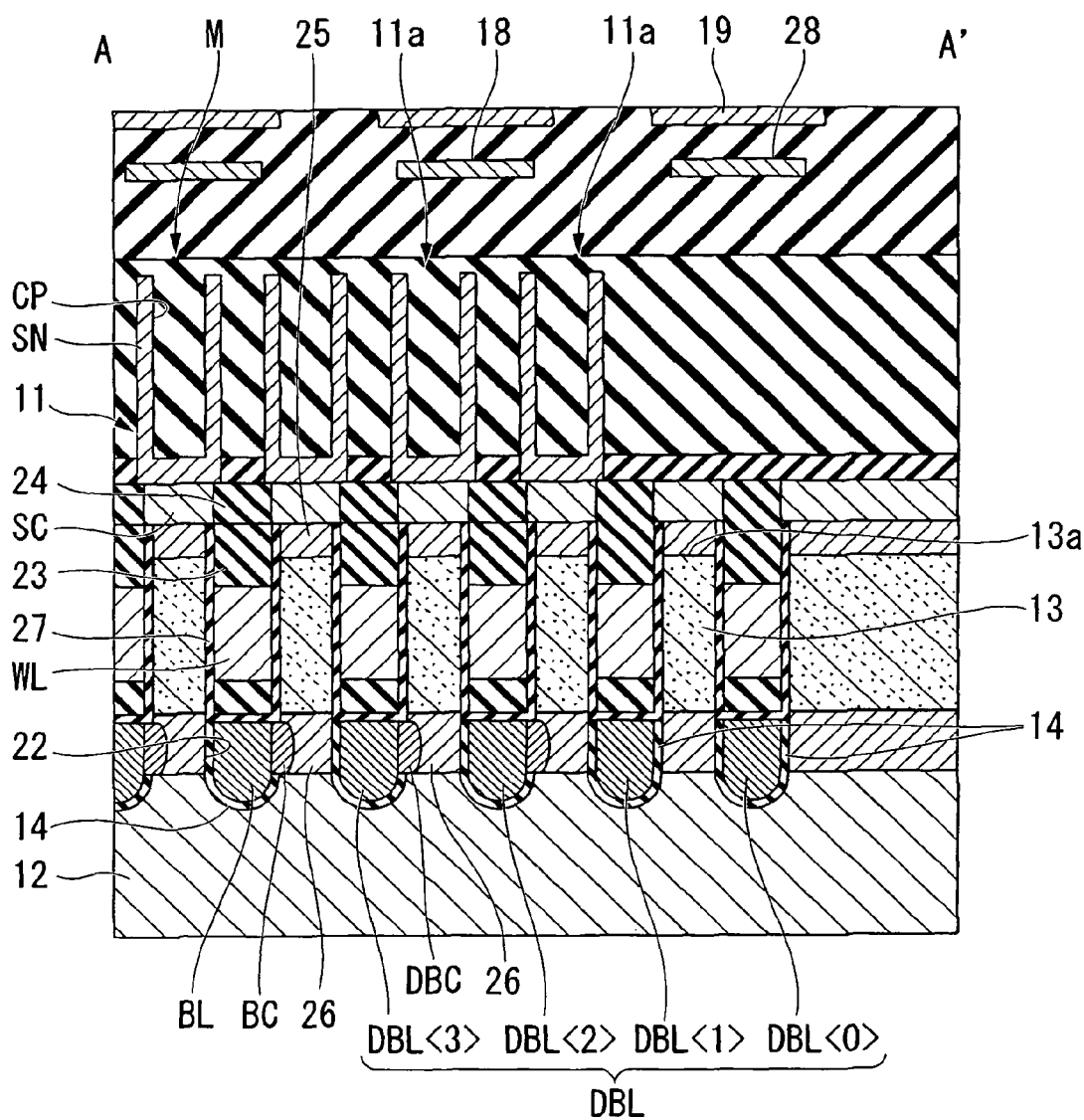
FIG. 6A is a fragmentary cross sectional elevation view, taken along A-A' line of FIG. 4, illustrating the semiconductor memory device in accordance with one embodiment of the present invention.
Figure 6B:
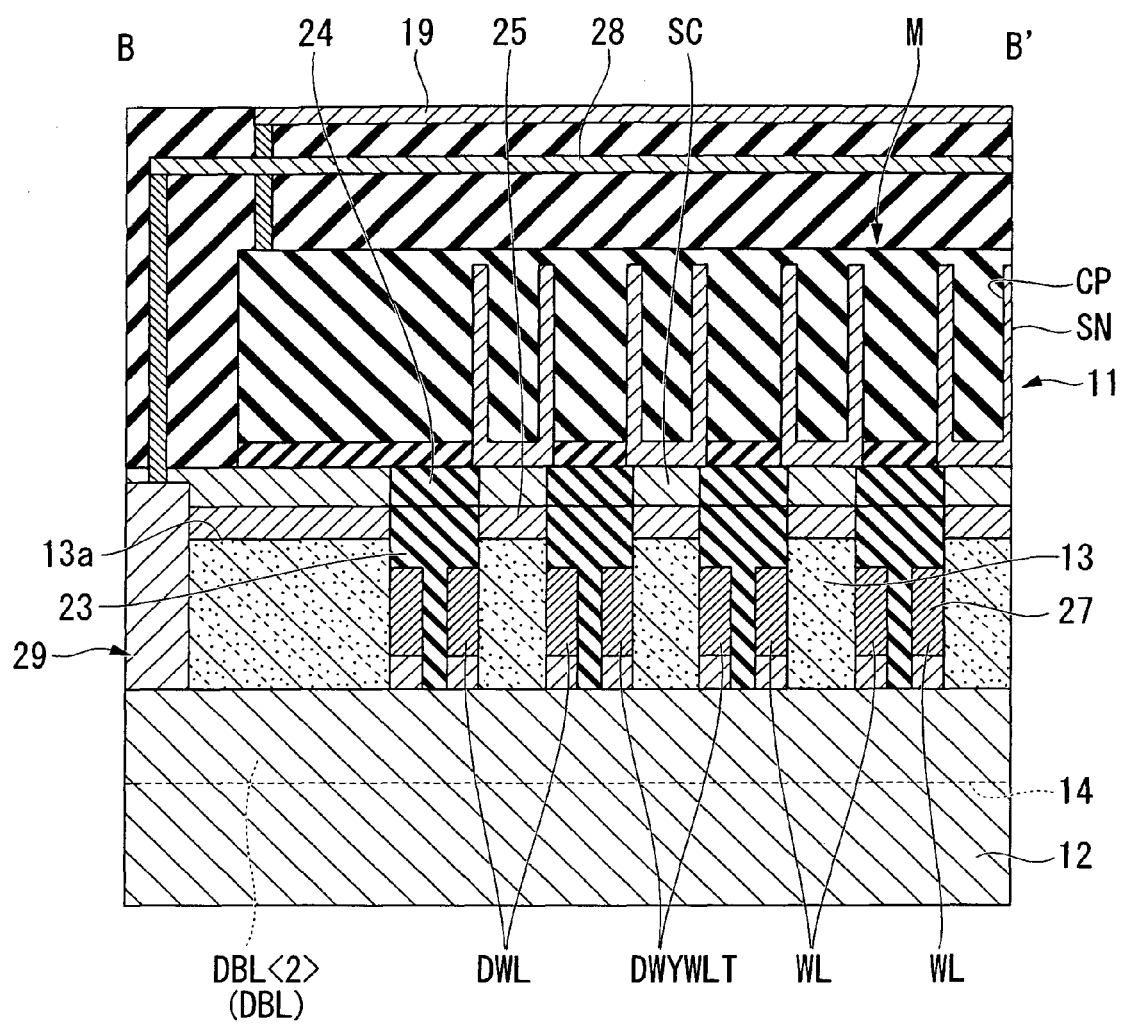
FIG. 6B is a fragmentary cross sectional elevation view, taken along B-B' line of FIG. 4, illustrating the semiconductor memory device in accordance with one embodiment of the present invention.

FIG. 1 is a schematic view illustrating the semiconductor memory device (DRAM) in accordance with one embodiment of the present invention. FIG. 2 is a fragmentary schematic view illustrating a bank in the semiconductor memory device of FIG. 1 in accordance with one embodiment of the present invention. FIG. 2 illustrates one of the banks illustrated in FIG. 1. FIG. 3 is a fragmentary schematic diagram illustrating an area surrounded by a broken line of the semiconductor memory device in FIG. 2 in accordance with one embodiment of the present invention. FIG. 4 is a fragmentary schematic diagram illustrating an area surrounded by a broken line of the semiconductor memory device in FIG. 3 in accordance with one embodiment of the present invention. FIG. 5 is fragmentary perspective view illustrating a memory cell of the semiconductor memory device in FIGS. 1 to 4 in accordance with one embodiment of the present invention. FIG. 6A is a fragmentary cross sectional elevation view, taken along A-A' line of FIG. 4, illustrating the semiconductor memory device in accordance with one embodiment of the present invention. FIG. 6B is a fragmentary cross sectional elevation view, taken along B-B' line of FIG. 4, illustrating the semiconductor memory device in accordance with one embodiment of the present invention.

The semiconductor memory device according to the present embodiment may include, but is not limited to, eight banks (BANK) disposed in the form of an array, and a plurality of bonding pads 1, as shown in FIG. 1. Although the example shown in the present embodiment is the semiconductor memory device including eight banks, the number of banks is not limited thereto, and can be, for example, four.

The bonding pads 1 are interfaces to the outside. The bonding pads 1 are used for performing data input and output. Therefore, the semiconductor memory device of the present embodiment operates by receiving the power supply necessary for operation from the bonding pads 1, commands that indicate details of control, and addresses including specification of a bank and specification of a memory cell within the bank. Then, the semiconductor device performs data output via the bonding pads 1.

According to the semiconductor memory device of the present embodiment, in addition to VDD (power supply potential) and VSS (ground potential) used as is in the internal circuit, VBL (bit line pre-charging potential) used for prescribed applications such as precharging of a bit line, this being generated in an internal power supply generating circuit 2 illustrated in FIG. 1.

The banks (BANK), as shown in FIG. 2, provide a plurality of structural units including memory cell blocks 3, sense amplifiers 4, and subword drivers 5.

As shown in FIG. 2, a plurality of the memory cell blocks 3 are arranged in the form of an array, along the X direction (first direction) and the Y direction (second direction), which is perpendicular to the X direction. On the outside of the edge part along the Y direction of each memory cell block 3, a sense amplifier 4 and a dummy bit line power supplying region (power supplying region) 4a (omitted from FIG. 2) are disposed. On the outside edge part along the X direction of each memory cell block 3, a subword driver 5 and a dummy word line power supplying region 5a (omitted from FIG. 2) are disposed.

According to the present embodiment, as shown in FIG. 2, each memory cell block 3 is sandwiched between the sense amplifiers 4 in the X direction, and sandwiched between the subword drivers 5 in the Y direction.

As shown in FIG. 2, main word drivers 6 are disposed adjacent to the subword drivers 5 disposed on the edge part along the X direction of the bank (BANK). In regions surrounded by the edge part of the sense amplifier 4 and the edge part of the subword driver 5, respective array control circuits 7 are disposed. The array control circuits 7 output control signals or the like for the sense amplifiers 4 and the subword drivers 5.

As shown in FIG. 3, the memory cell blocks 3 are provided with a plurality of bit lines BL (first signal wirings), a plurality of word lines WL (second signal wirings), a plurality of memory cells (not shown in FIG. 3), and dummy bit lines DBL (dummy wirings). The plurality of bit lines BL (first signal wirings) are arranged in parallel and extend in the X direction. The plurality of word lines WL (second signal wirings) are arranged in parallel and extend in the Y direction. Each of the plurality of memory cells (not shown in FIG. 3) is disposed in a vicinity of the point of intersection between the bit line BL and the word line WL. The dummy bit lines DBL (dummy wirings) run parallel to the bit lines BL extending in the X direction.

In the present embodiment, as shown in FIG. 3, of the plurality of word lines WL, the word line of outermost column is a dummy word line DWL (a third wiring). A wafer-level burn-in dummy word line DMYWLT is provided between the dummy word line DWL and word line WL. A wafer level burn-in is performed to eliminate initial failures. When the wafer-level burn-in is performed, all the word lines WL on the wafer are supplied with an electrical potential that is set higher than the electrical potential level for usual operation. At the time of a wafer-level burn-in, the wafer-level burn-in dummy word line DMYWLT is supplied with an electrical potential that is substantially the same as the word line WL.

By providing the wafer-level burn-in dummy word line DMYWLT, compared to the word lines WL disposed further from the dummy word line DWL than the wafer-level burn-in dummy word line DMYWLT or the memory cells or capacitors connected thereto, the memory cell or the capacitor connected to the wafer-level burn-in dummy word line DMYWLT can avoid insufficient stress at the time of wafer-level burn-in.

The bit line BL is connected to the sense amplifier 4 (SAMP). The sense amplifier 4 is disposed adjacent to the memory cell block 3 and controls the bit line BL. The sense amplifier 4 amplifies the data (voltage) on the bit line BL in an active mode, supplies VBL (bit line pre-charging potential) to the bit line BL in a pre-charge mode. The semiconductor device is operated in the active mode when receives an active command, a read command, or a write command and operated in the pre-charge mode when receives a pre-charge command.

Also, the dummy bit lines DBL are disposed at the edge part of the memory cell block 3. The dummy bit lines DBL are connected to a dummy bit line power supplying regions 4a. The dummy bit line power supplying regions 4a, as shown in FIG. 3, supply an electrical potential to the dummy bit lines DBL. The dummy bit line power supplying regions 4a are disposed so as to sandwich the Y direction edge part of each sense amplifier 4 between adjacent memory cell blocks 3.

In the present embodiment, as shown in FIG. 4, the sense amplifier 4 is provided with an amplifier and a pre-charging circuit. The amplifier amplifies the electrical potential on one pair of bit lines (for example, in FIG. 4, the outermost bit line BL and BLB <0>). The pre-charging circuit pre-charges the electrical potential VBL on the pair of bit lines in response to a signal PREC. VBL (the bit line pre-charging potential) is substantially one-half of the electrical potential difference between CSP and CSN as shown in FIG. 4.

As shown in FIG. 3, four dummy bit lines DBL are provided at each of both edge parts along the X direction of the memory cell block 3.

In the present embodiment, although there are four dummy bit lines DBL provided on each of both edge parts of the memory cell block 3, the number of dummy bit lines DBL is not limited thereto. The number of dummy bit lines DBL can be three or two each on both edge parts of the memory cell block 3.

The more dummy bit lines DBL that are provided, the larger the surface area of the memory cell block 3 must be made. For this reason, it is desirable that the number of dummy bit lines DBL is a number that enables the shape of the outermost column of bit lines BL to be formed with sufficient precision, and also a number of that is small.

According to the present embodiment, as shown in FIG. 4, of four dummy bit lines DBL that are disposed on both edge parts of the memory cell block 3, up to the third dummy bit line from the outermost one (the first dummy wiring), these being DBL<0>, DBL<1>, and DBL<2>, are supplied with a fixed potential. The fixed potential may be an electrical potential that is substantially the same as the electrical potential supplied to the semiconductor substrate (VSS (ground potential)).

According to the present embodiment, the semiconductor substrate refers to the substrate on which the transistors (vertical transistors) of the memory cells are formed. For example, in the case in which, using a known triple-well configuration, the transistor in a memory cell is provided in a region of a p-well in the semiconductor substrate, the region of the p-well is referred to as the semiconductor substrate.

A bit line BL pre-charging potential (VBL) that is substantially the same as the electrical potential supplied to the bit line BL is supplied to the dummy bit line DBL (the second dummy wiring) <3> that is adjacent to the bit line BL among the four dummy bit lines DBL disposed on both edge parts of the memory cell block 3, as shown in FIG. 4.

In this manner, in the case in which a plurality of dummy bit lines DBL are provided and the dummy bit line DBL<3> that is adjacent to the bit line BL is supplied with an electrical potential that is substantially the same electrical potential as the electrical potential supplied to the bit line BL, it is possible to make the potential environment of the outermost column bit line BL substantially the same as the environment of other bit lines BL.

According to the present embodiment, all the bit lines BL is sandwiched between the bit lines BL supplied with VBL or between the bit line BL and the dummy bit line DBL supplied with VBL. For this reason, according to the present embodiment, the electrical potential environments of all bit lines BL are substantially the same. Therefore, the semiconductor memory device according to the present embodiment has higher reliability than a semiconductor memory device in which all bit lines are not in the same electrical potential environment.

As shown in FIG. 3, the word line WL is connected to the subword driver 5 (Word Driver) that is disposed adjacently to the memory cell block 3, and an active or inactive state is controlled by the subword driver 5. The subword driver 5 and the main word driver 6 (refer to FIG. 2) control the word line WL.

The dummy word line DWL is disposed on the edge part of the memory cell block 3, and is connected to the dummy word line power supplying region 5a. The dummy word line power supplying region 5a, as shown in FIG. 3, supplies an electrical potential to the dummy word line DWL. The dummy word line power supplying region 5a is disposed between adjacent memory cell blocks 3. The dummy word line power supplying regions 5a sandwich the X-direction edge part of each subword driver 5.

According to the present embodiment, as shown in FIG. 4, the subword driver 5 is also supplied with VPP (boost potential) used in the drive (activation) of the word line WL or supplied with VKK (negative potential) used as a potential at the time of non-selection (non-activation) of the word line WL.

According to the present embodiment, as shown in FIG. 3, one dummy word line DWL is provided at each of both edge parts along the Y direction of the memory cell block 3. Although the number of the dummy word lines DWL is not particularly restricted, the more dummy word lines DWL that are provided, the larger the surface area of the memory cell block 3 must be made. For this reason, it is desirable that the number of dummy word lines DWL is a number that enables the shape of the outermost column of word lines WL to be formed with sufficient precision, and also a number of that is small.

As shown in FIG. 4, the dummy word lines DWL that are disposed at both edge parts of the memory cell block 3 are supplied with VSS (ground potential).

In this manner, in the case in which the dummy word line DWL nearest to the word line WL is supplied with an electrical potential that is substantially the same as the electrical potential supplied to the word line WL, it is possible to make the potential environment of the outermost column word line WL substantially the same as the environment of other word lines WL. For this reason, the semiconductor device according to the present embodiment has higher reliability than a semiconductor memory device in which all word lines WL are not in the same electrical potential environment.

A memory cell provided to the semiconductor memory device according to the present embodiment will be described in detail.

A memory cell M, as shown in FIG. 5, may include, but is not limited to, a vertical transistor including a columnar semiconductor 13 and a capacitor 11 connected to the vertical transistor. The vertical transistor and the capacitor 11 are disposed in a vicinity of a point of intersection between the bit line BL and the word line WL. Only intersection points between two word lines WL and three bit lines BL shown in FIG. 4 (the bit line illustrated in the rear in FIG. 5 does not connect with a transistor) are extracted and illustrated in FIG. 5. Also, to facilitate the understanding of the drawings, only two capacitors 11 are illustrated, and the illustration of the capacitors 11 which are provided on the upper parts of the remaining two columnar semiconductors 13 are omitted.

Each vertical transistor configuring the memory cell M, as shown in FIG. 6A and FIG. 6B, may include, but is not limited to, a columnar semiconductor 13 of the semiconductor substrate 12, an upper diffusion layer (upper conductive layer) 25, a lower diffusion layer (lower conductive layer) 26, a gate diffusion layer 27 which is not shown in FIG. 5, and a pair of gate electrodes. The semiconductor substrate 12 includes a first type impurity, for example, an n-type impurity such as phosphorus. The upper diffusion layer 25 is one of source and drain regions (S/D) of the vertical transistor formed on the upper part of the columnar semiconductor 13. The lower diffusion layer 26 is the other of the source or drain region (S/D) of the vertical transistor formed on the lower part of the columnar semiconductor 13. The upper diffusion layer 25 and the lower diffusion layer 26 include a second type impurity which is different from the first type impurity, for example, a p-type impurity such as boron. The pair of gate electrodes faces the columnar semiconductor 13 through a gate diffusion layer 27.

According to the present embodiment, as shown in FIG. 6A, the bit line BL is connected to the lower diffusion layer 26 of the vertical transistor through a bit line contact BC. The word line WL functions as a gate electrode of the vertical transistor.

The capacitor 11 is formed over the upper diffusion layer 25 of each vertical transistor of the memory cell M. The capacitor 11 is connected to the upper diffusion layer 25 through a storage node contact SC (omitted from FIG. 5).

The capacitor 11 may include, but is not limited to, a lower electrode that is a storage node SN, a capacitive insulating film, and an upper electrode that is a cell plate CP. The columnar semiconductor 13 and the storage node contact SC are insulated and separated by interlayer insulating films 23 and 24 respectively.

According to the present embodiment, as shown in FIG. 5, the bit line BL and the dummy bit line DBL extending in the X direction crosses the word line WL and the dummy word line DWL extending in Y direction perpendicularly when viewed in plan-view manner. As shown in FIG. 6A and FIG. 6B, the dummy transistor is provided in a vicinity of the point of intersection between the dummy bit line DBL and the word line WL. The dummy transistor has substantially the same sectional structure as the vertical transistor of the memory cell M.

The vertical transistor that configures the memory cell M and the dummy transistor is provided in a p-well region that is an active region of the semiconductor substrate 12. As shown in FIG. 5, a plurality of trenches 22 extending in the X direction and Y direction are formed in the semiconductor substrate 12. The region between the trenches 22 is the columnar semiconductor 13, including the part functioning as a channel of the vertical transistor. The columnar semiconductor 13 is provided by forming the trench 22 in the active region of semiconductor substrate 12 in the X direction and the Y direction. As shown in FIG. 5, FIG. 6A and FIG. 6B, the member disposed lower than the surface 13a of the columnar semiconductor 13 is the member which is embedded into the semiconductor substrate 12.

An insulating film 14 which may be a thermally oxidized film and the like is formed on the inner wall at the bottom part of each trench 22. As shown in FIG. 5 and FIG. 6A, the bit line BL and the dummy bit line DBL are embedded into the semiconductor substrate 12 on the insulating film 14. Therefore, the insulating film 14 is interposed between the bit line BL and the semiconductor substrate 12 or between the dummy bit line DBL and the semiconductor substrate 12.

As shown in FIG. 5 and FIG. 6A, the dummy bit line DBL has substantially the same cross-sectional form as the bit line BL. The spacing between the dummy bit line DBL and the bit line BL is substantially the same as the spacing between adjacent bit lines BL. The dummy bit line DBL is disposed in the same level as the bit line BL. The dummy bit line DBL has substantially the same pattern as the bit line BL.

Also, each of the bit lines BL is connected to the lower diffusion layer 26 via the bit line contact BC made of a conductive material. The lower diffusion layer 26 is the source or drain region (S/D) of the vertical transistor of the memory cell M. The lower diffusion layer 26 is provided on the lower part of each columnar semiconductor 13.

As shown in FIG. 6A, of the dummy bit lines DBL, up to the second dummy bit line from the outermost one (the first dummy wiring), these being the dummy bit lines DBL<0> and DBL<1>, are supplied with an electrical potential that is substantially the same as the electrical potential supplied to the semiconductor substrate 12 (VSS (ground potential)). The dummy bit lines DBL<0> and DBL<1> are insulated from the dummy transistor by the insulating film 14.

The capacitor 11 is not formed on the columnar semiconductor 13 disposed between the dummy bit lines DBL<0> and DBL<1>.

Of the dummy bit line DBL, the third dummy bit line DBL <2> (the first dummy wiring) from the outermost one is supplied with the electrical potential that is substantially the same as the electrical potential supplied to the semiconductor substrate 12 (VSS (ground potential)). The third dummy bit line DBL <2> is connected to the lower diffusion layer 26 of the dummy transistor via a contact DBC made of a conductive material.

As shown in FIG. 6A, of the dummy bit line DBL, the dummy bit line DBL <3> (the second dummy wiring) adjacent to the bit line BL is supplied with an electrical potential (VBL) that is substantially the same as the electrical potential supplied to the bit line BL. The dummy bit line DBL <3> is connected to the lower diffusion layer 26 of the dummy transistor via the contact DBC of the conductive material, as the same as the bit line BL.

As shown in FIG. 6A, each of dummy capacitors 11a is formed on the columnar semiconductors 13 that are connected to the dummy bit lines DBL <2> and DBL <3>.

According to the present embodiment as shown in FIG. 6A, the capacitor 11 is not formed on the columnar semiconductor 13 disposed between the dummy bit lines DBL<0> and DBL<1>. Each of the dummy capacitors 11a is formed on the columnar semiconductor 13 that is connected to the dummy bit lines DBL <2> and DBL <3>. The dummy capacitor 11a is provided for forming the shape of the capacitor 11 in a stable and a highly accurate manner.

According to the present embodiment, each of the dummy capacitors 11a is formed on the columnar semiconductor 13 that is connected to the dummy bit lines DBL <2> or DBL <3>. Even if the capacitor 11 is not formed on the columnar semiconductor 13 disposed between the dummy bit lines DBL<0> and DBL<1>, the shape of the capacitor 11 can be formed in a stable and a highly accurate manner. This leads to high productivity without formation of the capacitor 11 on the columnar semiconductor 13 disposed between the dummy bit lines DBL<0> and DBL<1>.

As shown in FIG. 6A and FIG. 6B, of the dummy bit lines DBL, up to the third dummy bit line from the outermost one (the first dummy wiring), these being DBL<0>, DBL<1>, and DBL<2>, are supplied with an electrical potential (VSS (ground potential)) via a contact plug 29 from an upper layer wiring 28 (a wiring layer) that is provided above the bit line BL. The contact plug 29 is provided on a dummy bit line power supplying region 4a, as shown in FIG. 3, which is disposed on the outside edge part along the Y direction of each the memory cell block 3.

As shown in FIG. 6A, of the dummy bit lines DBL, the bit line BL and the dummy bit line DBL <3> (the second dummy wiring) that is adjacent to the bit line BL are supplied with a potential (VBL) from an upper layer wiring 18 (a wiring layer) provided above the bit line BL via a contact plug, not shown in the drawings. The contact plug is provided on the dummy bit line power supplying region 4a or the sense amplifier 4.

The word line WL and the dummy word line DWL, as shown in FIG. 6B, are supplied with a potential (VSS (ground potential)) from an upper layer wiring 19 (a wiring layer) above the word line WL via a contact plug, not shown in drawing. The contact plug is provide on the subword driver 5 or the dummy word line power supplying region 5a.

As shown in FIG. 6A and FIG. 6B, the upper layer wiring 28 and the upper layer wiring 18 are formed in the same layer in a depth direction of the substrate. The upper layer wiring 28 supplies the electrical potential to the dummy bit lines (the first dummy wirings) DBL<0>, DBL<1>, and DBL<2>. The upper layer wiring 18 supplies an electrical potential to the dummy bit line (the second dummy wiring) DBL <3> adjacent to the bit line BL. The positions of the upper layer wiring 28 and the upper layer wiring 18 are different in the depth direction of the substrate from the upper layer wiring 19 which supplies an electrical potential to the word line WL and the dummy word line DWL.

The semiconductor device according to the present embodiment may include, but is not limited to, the plurality of bit lines BL, the word lines WL, the memory cells M, the dummy bit lines DBL. The plurality of bit lines BL are arranged substantially in parallel to each other and extends in the X direction. The plurality of bit lines BL are embedded in the semiconductor substrate 12. The word lines WL extend in the Y direction that intersect with the X direction. The memory cells M are provided in a vicinity of the points of intersections between the bit lines BL and the word lines WL. The dummy bit lines DBL, of a plurality of the bit lines, are provided outside the bit line BL at the outermost column. The dummy bit lines DBL are substantially parallel to the bit lines BL and extend in the X direction. The dummy bit line DBL may include; but is not limited to, the dummy bit lines (first dummy wirings) DBL<0>, DBL<1>, and DBL<2> that are supplied with the electrical potential that is substantially the same as the electrical potential supplied to the semiconductor substrate 12. Even if a short occurs between the dummy bit lines DBL<0>, DBL<1>, and DBL<2> and semiconductor substrate 12, a leakage current does not flow therebetween. As a result of this, it is possible to provide the semiconductor device with immunity to the occurrence of problems such as an increase of a standby currency that hinders the achievement of low power consumption in the semiconductor device, resulting in suitability for achieving low power consumption.

According to the semiconductor memory device of the present embodiment, the plurality of the dummy bit lines DBL are provided, and the dummy bit line DBL <0> disposed at the outermost position among the dummy bit lines is supplied with the electrical potential that is substantially the same as the electrical potential supplied to the semiconductor substrate 12. Therefore, it is possible to effectively prevent leakage currents caused by a short between the dummy bit line DBL <0> and the semiconductor substrate 12.

According to the semiconductor memory device of the present embodiment, because the insulating film 14 is interposed between the dummy bit line DBL and the semiconductor substrate 12, a short can be prevented between the dummy bit line DBL and the semiconductor substrate 12.

According to the present embodiment, the dummy bit lines DBL are also provided to be father from the bit lines BL than the dummy bit line DBL <3> that is adjacent to the bit line BL. Therefore, the shape of the dummy bit line DBL <3> that is adjacent to the bit line BL and the shape of the insulating film 14 between the dummy bit line DBL <3> and the semiconductor substrate 12 can be formed with high precision. As the result of this, a short between the dummy bit line DBL <3> being the dummy bit line DBL supplied with the bit line BL pre-charging potential (VBL) and the semiconductor substrate 12 can be prevented effectively by the insulating film 14.

The semiconductor memory device according to the present embodiment is suitable for miniaturization because the memory cell M has the vertical transistor.

According to the semiconductor memory device of the present embodiment, because the dummy bit line DBL has substantially the same sectional structure as the bit line BL, and the space between the dummy bit line DBL and the bit line BL is substantially the same as the space adjacent to bit lines BL therebetween, it is possible to form the shape of the bit line BL disposed in the outermost column with substantially the same precision as the shape of the other bit lines BL.

According to the semiconductor memory device of the present embodiment, the plurality of word lines WL extend in a line and are embedded into the semiconductor substrate 12. Of the plurality of the word lines WL, the word line WL at the outermost column is the dummy word line DWL. Therefore, it is possible to form the shape of the word line WL disposed adjacent to the dummy word line DWL with substantially the same precision as the shape of the other word lines WL.

The present embodiment can also be applied in the same manner to other semiconductor memories (such as an SRAM (static random access memory), a flash memory, a PRAM (a phase-change random access memory), an MRAM (a magnetoresistive random access memory)) and semiconductor devices such as a controller, including lines, such as bit lines and word lines, which are multiply disposed in an array, the lines themselves being embedded into the semiconductor substrate. The above described description can be applied to a dummy wiring adjacent to any signal wirings.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware that is constructed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a first signal wiring configured to be supplied with a first signal potential;
   a first dummy wiring insulated from the first signal wiring, the first dummy wiring being configured to be supplied with a fixed potential; and
   a second dummy wiring between the first signal wiring and the first dummy wiring, the second dummy wiring being insulated from the first dummy wiring, the second dummy wiring being configured to be supplied with substantially the same potential as the first signal potential.

2. The semiconductor device according to claim 1, wherein the first signal wiring and the first and second dummy wirings are disposed in substantially the same level as each other.

3. The semiconductor device according to claim 2, wherein the first and second dummy wirings have substantially the same line-pattern as the first signal wiring.

4. The semiconductor device according to claim 3, further comprising:
   a substrate embedded with the first signal wiring and the first and second dummy wirings.

5. The semiconductor device according to claim 4, further comprising:
   a memory cell coupled to the first signal wiring.

6. The semiconductor device according to claim 4, wherein the fixed potential is substantially the same potential as a potential of the substrate.

7. The semiconductor device according to claim 1, further comprising:
   a first dummy transistor coupled to the second dummy wiring, the first dummy transistor being insulated from the first dummy wiring.

8. The semiconductor device according to claim 1, further comprising:
   a first memory cell; and
   a word line coupled to the first memory cell,
   wherein the first wiring is a first bit line embedded in a semiconductor substrate, and the first and second dummy wirings are embedded in the semiconductor substrate.

9. The semiconductor device according to claim 8, wherein the second dummy wiring is configured to be supplied with a bit line pre-charging potential.

10. The semiconductor device according to claim 8, wherein the first memory cell comprises:
    a capacitor; and
    a memory cell transistor coupled to the capacitor.

11. A semiconductor device comprising:
    a bit line configured to be supplied with a first voltage in a first mode, the bit line being configured to be free from the first voltage in a second mode;
    a first dummy bit line provided adjacently to the bit line, and the first dummy bit line being configured to be supplied with the first voltage in each of the first and second modes; and
    a second dummy bit line provided adjacently to the first dummy bit line, the second dummy bit line being configured to be supplied with a second voltage in each of the first and second modes, and the second voltage being different from the first voltage.

12. The semiconductor device according to claim 11, further comprising:
    a first voltage line electrically coupled to the first dummy bit line;
    a second voltage line electrically coupled to the second dummy bit line; and
    a pre-charge transistor provided between the bit line and the first voltage line, the pre-charge transistor being configured to turn on in the first mode and turn off in the second mode.

13. The semiconductor device according to claim 11, further comprising:
    a semiconductor substrate configured to be supplied with the second voltage, and the first voltage being greater than the second voltage.

14. The semiconductor device according to claim 11, further comprising:
    a third dummy bit line provided adjacently to the second dummy bit line, the third dummy bit line being configured to be supplied with the second voltage.

15. The semiconductor device according to claim 14, further comprising:
    first, second and third memory cell transistors coupled to the bit line, the first dummy bit line and the second dummy bit line, respectively, and the third dummy bit line being disconnected from any memory cell transistor.

16. The semiconductor device according to claim 11, wherein the first mode includes a pre-charge mode corresponding to a pre-charge command, and
    the second mode includes an active mode corresponding to each of read and write commands.

17. The semiconductor device according to claim 1, wherein the fixed potential comprises ground potential.

18. The semiconductor device according to claim 1, wherein the first signal wiring and the first dummy wiring are formed on a substrate and the fixed potential is substantially the same as a potential of the substrate.

* * * * *